(12) United States Patent
Jain

(10) Patent No.: US 6,621,752 B2
(45) Date of Patent: Sep. 16, 2003

(54) REFRESHING SCHEME FOR MEMORY CELLS A MEMORY ARRAY TO INCREASE PERFORMANCE OF INTEGRATED CIRCUITS

(75) Inventor: Raj Kumar Jain, Singapore (SG)

(73) Assignee: Infineon Technologies Aktiengesellschaft, St. Martin (DE)

( * ) Notice: Subject to any disclaimer, the term of this patent is extended or adjusted under 35 U.S.C. 154(b) by 0 days.

(21) Appl. No.: 10/065,213

(22) Filed: Sep. 26, 2002

(65) Prior Publication Data

US 2003/0063516 A1 Apr. 3, 2003

Related U.S. Application Data

(63) Continuation-in-part of application No. 09/806,299, filed on Oct. 3, 2001, now Pat. No. 6,552,951.

(51) Int. Cl.$^7$ .................................................. G11C 7/00
(52) U.S. Cl. ............... 365/222; 365/189.04; 365/230.05
(58) Field of Search ........................... 365/230.03, 233, 365/189.04, 222, 230.02, 230.05

(56) References Cited

U.S. PATENT DOCUMENTS 6,233,193 B1 * 5/2001 Holland et al. ............. 365/222
6,282,606 B1 * 8/2001 Holland .................. 365/189.04

* cited by examiner

*Primary Examiner*—Thong Le
(74) *Attorney, Agent, or Firm*—Dexter Chin

(57) ABSTRACT

In an IC having memory cells, a write operation is performed on a word within a particular row of memory cells. The other words within the same row are refreshed during the same cycle. In another embodiment, dual port memory cells are employed to enable a second row of memory cells to be refreshed during the same cycle.

12 Claims, 5 Drawing Sheets

REFRESHING SCHEME FOR MEMORY CELLS A MEMORY ARRAY TO INCREASE PERFORMANCE OF INTEGRATED CIRCUITS

CROSS REFERENCE TO RELATED APPLICATIONS

This is a continuation-in-part of patent application, titled: "Dual-Port Memory Cell", U.S. Ser. No. 09/806,299, filed Oct. 3, 2001, now U.S. Pat. No. 6,552,951.

BACKGROUND OF INVENTION

ICs can include an array of DRAM cells. The memory cells comprise a storage node which carries a charge that represents the stored information. Due to parasitic leakage paths, the charge stored within the storage node decreases. The charge must be refreshed at least once during the retention time. The retention time is set such that the storage node has always enough charge so that it can be detected by a sense amplifier. During a refresh cycle, the information stored in the memory cells of a row is read out, amplified, and written back into the memory cells of that row.

In conventional ICs, when an array is refreshed, the memory array is prevented from read or write accesses. Accesses are permitted only after the refresh operation is completed. The necessity of refresh operation hinders the performance of the memory array.

From the foregoing discussion, it is desirable to provide memory arrays which reduces the performance degradation associated with refresh operations.

SUMMARY OF INVENTION

The invention relates generally to improving performance of memory accesses in ICs with memory cells. In one embodiment, an IC comprises an array of memory cells arranged in rows and columns. A row includes a plurality of words in which a word comprises x memory cells, where x is greater than or equal to 1. During a memory access cycle, one of the words in a selected row is accessed. At least one other word in the selected row is refreshed during the same memory access cycle. Preferably some of the other words in the selected row are refreshed during the same memory access cycle, and more preferably the other words in the selected row are refreshed during the same memory cycle.

DETAILED DESCRIPTION

Figure 1:
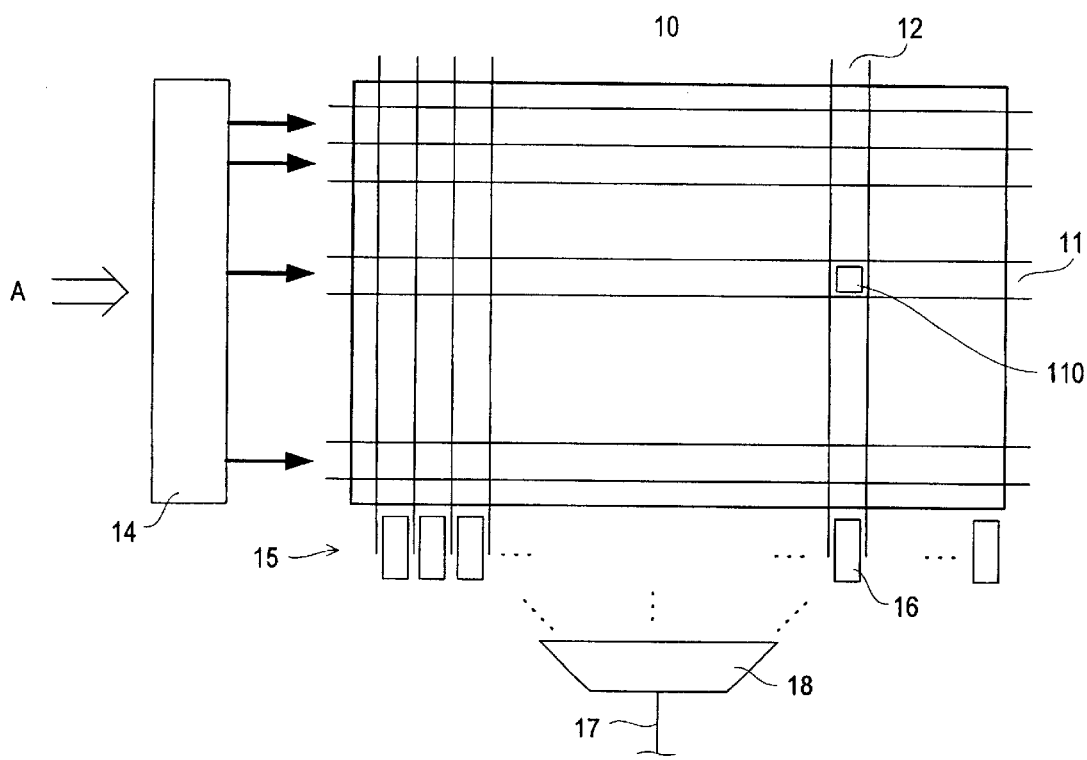
FIG. 1 shows a block diagram of a memory array in accordance with one embodiment of the invention.

FIG. 1 shows a memory cell array 10 in accordance with one embodiment of the invention. The array can be part of an IC, such as a system-on-chip IC. Other types of ICs, such as memory ICs are also useful. The memory cells are arranged in rows and columns, interconnected by bitlines in the column direction and wordlines in the row direction. For example, a memory cell 110 belongs to row 11 and to column 12. In one embodiment, the memory cells are DRAM cells. A DRAM cell comprises, for example, a cell transistor having first and second terminals and a gate. The first terminal is coupled to a bitline, the gate is coupled to a wordline, and the second terminal is coupled to a first electrode of a capacitor. The second electrode of the capacitor is coupled to, for example, a reference voltage, such as $V_{DD}/2$ coupled to a capacitor. Other types of DRAM cells, such as multi-port cells are also useful.

A row decoder 14 selects one of the rows in response to a row address. A row may comprise, for example, 256, 512, or 1024 memory cells. Other number of memory cells can be provided in a row. Preferably, the number of memory cell in a row is equal to $2^x$, where x is a whole number. More preferably, x is greater than $2^5$. All the memory cells of a row are physically or logically coupled to a wordline which is controlled by the row decoder.

The memory array comprises a sense amplifier bank 15 having a plurality of sense amplifiers. A sense amplifier corresponds or is coupled to a column of memory cells. One of the sense amplifiers, for example, sense amplifier 16, corresponds to a column of memory cells to which memory cell 110 is located. Typically, a sense amplifier is coupled to first and second bitlines, each coupled to respective memory cells. The first and second bitlines form a column. Illustratively, the column is arranged in an open-bitline architecture. That is, the bitlines of the column are on opposite sides of the sense amplifier. However, for simplification, only one bitline of the column is shown in FIG. 1. Other bitline architectures, such as folded or open-folded, are also useful. When a wordline is activated, memory cells of the wordline are coupled to their respective bitlines.

A data bus 17 is coupled to the sense amplifier by a multiplexing circuit 18. The data bus comprises a width that is less than the number of columns of memory cells in a row. The data bus enables the external system environment to access the memory array. The term external system environment, as used herein, merely refers to the fact that the system is external to the memory array. It does not necessarily mean that the system is external to the IC. Depending on the design or application, the data bus 17 has, for example, a width of 16 or 32 bits. Other widths, such as 1 or larger, are also useful. Preferably, the width of the data line is equal to $2^y$, where y is a whole number. In one embodiment, the width of the data bus is less than the number of cells in a row (e.g., y<n). Preferably, the number of cells in a row is a multiple of the width of the data bus. A word of memory cells within a row of memory cells to which data is to be written or from which data is to be read is selected through the multiplexing circuit 18.

The multiplexing circuit performs, for example multiplexing and demultiplexing functions. During a read or a write memory access, the row of memory cells which contains the word of memory cells which is to be read or written is selected, causing the memory cells of the selected row to be coupled to the respective bitlines. Only the memory cells of the selected word which receive data from or provide data to the data bus 17 are selected by multiplexing circuit 18.

Figure 2:
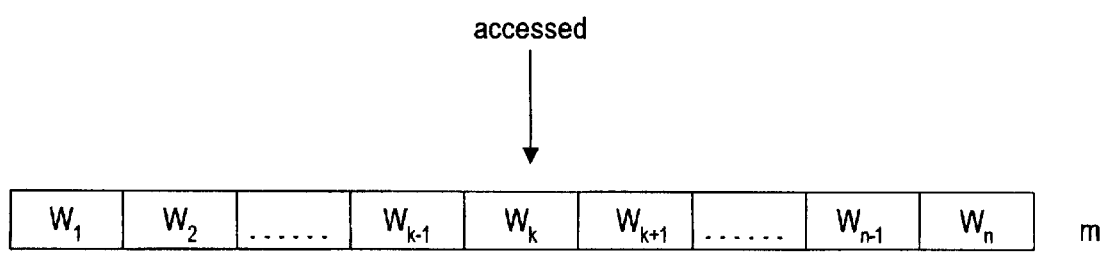
FIG. 2 shows a row of memory cells in accordance with one embodiment of the invention.

FIG. 2 shows a row m of memory cells in accordance with one embodiment of the invention. The row is separated into a plurality of words W. In one embodiment, a word comprises the same number of memory cells as the width of the data bus. As shown, the row comprises n words. The $k^{th}$ word of the row is accessed. The access, for example, is a write access. Alternatively, the access is a read access. The respective bitlines of the cells of the k$^{th}$ word are coupled to the sense amplifiers and driven onto the data bus through the multiplexing circuit. In accordance with one embodiment of the invention, at least one other word of the row is refreshed during the memory access. Preferably some of the other words of the row are refreshed, and more preferably the other words of the row are refreshed. The charge stored within the storage nodes of the memory cells of the refreshed words in row m are sensed and amplified by the corresponding sense amplifiers of sense amplifier bank and written back into the memory cells. As shown, the bits of a word are contiguous. Arranging bits of a word which are interleaved with bits from other word or words is also useful.

When a word in a row is accessed, at least one other word of that row is read and thereby refreshed. Preferably the other words of the selected row are refreshed. In contrast to a normal read operation, the data is not forwarded to the data bus since the data bus is connected to the accessed word of that row. This enables the row to avoid the need of a refresh or extend the refresh cycle time for the row. Hence, the availability of the memory device for additional read or write accesses is enhanced.

Figure 3:
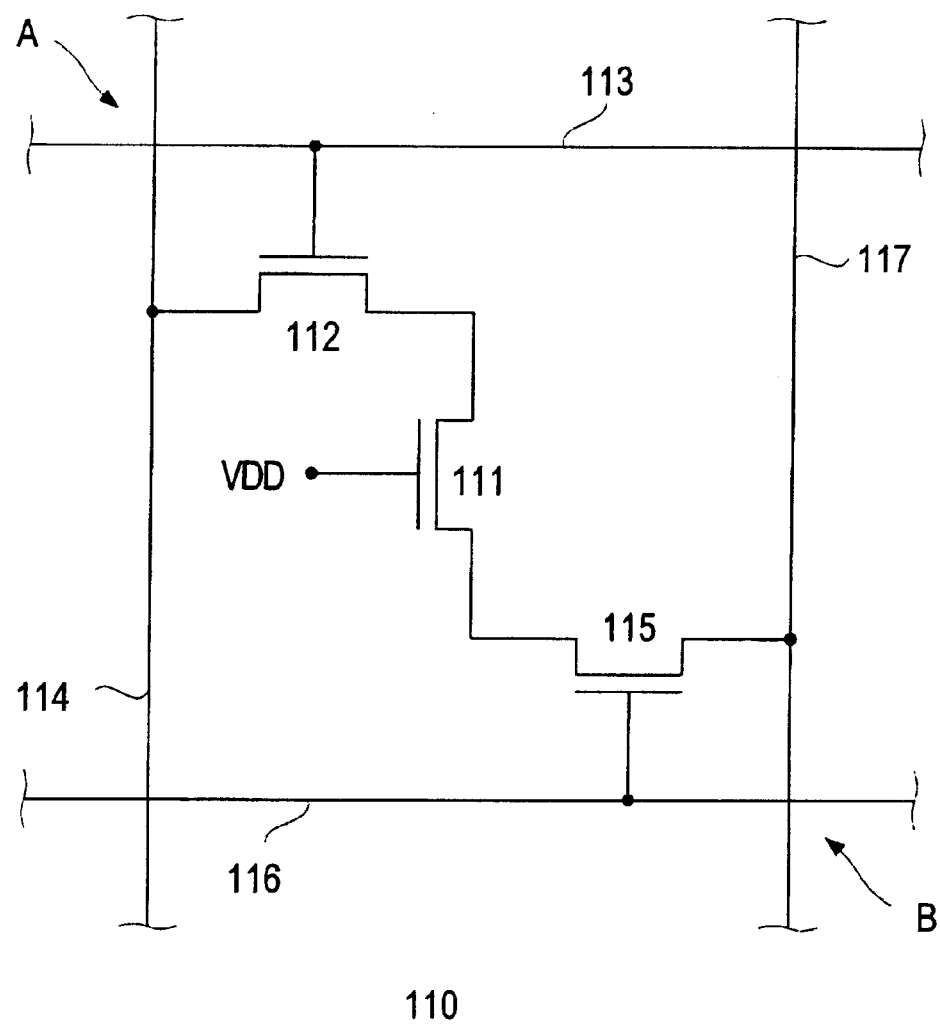
FIG. 3 shows a memory cell in accordance with one embodiment of the invention.

FIG. 3 shows a memory cell in accordance with one embodiment of the invention. The memory cell is a dual-port dynamic memory cell. Such a memory cell is described in, for example, co-pending patent applications, titled "Dual-Port Memory Cell", U.S. Ser. No. 09/806,299 (attorney docket number: 98P 0281 6WOUS) and titled "Memory Architecture with Refresh and Sense Amplifiers", U.S. Ser. No. 09/855,147 (attorney docket number: 00P1 9334US), which is herein incorporated by reference for all purposes. The information is stored in form of a charge in storage node 111. In one embodiment, the storage node 111 comprises a transistor whose gate electrode is connected to a reference potential, for example, the positive supply voltage $V_{DD}$. One end of the drain/source path of the storage transistor 111 is connected to wordline 113 and to bitline 114 through a first selection transistor 112. Wordline 113 and bitline 114 are connected to a first access port A. The other end of the drain/source path of storage transistor 111 is connected to another wordline 116 and another bitline 117 through selection transistor 115. The other wordline 116 and bitline 117 are coupled to another port B of the memory device. Providing DRAM cells having more than 2 ports or other types of multi-port DRAM cells are also useful.

Each port is associated with a row and a column decoder. In one embodiment, the first port is accessed by the external system while the second port is hidden to the external system and used for internal operations. Preferably, the second port is used to refresh the memory cells. Alternatively, both ports can be accessed by the external system.

Figure 4:
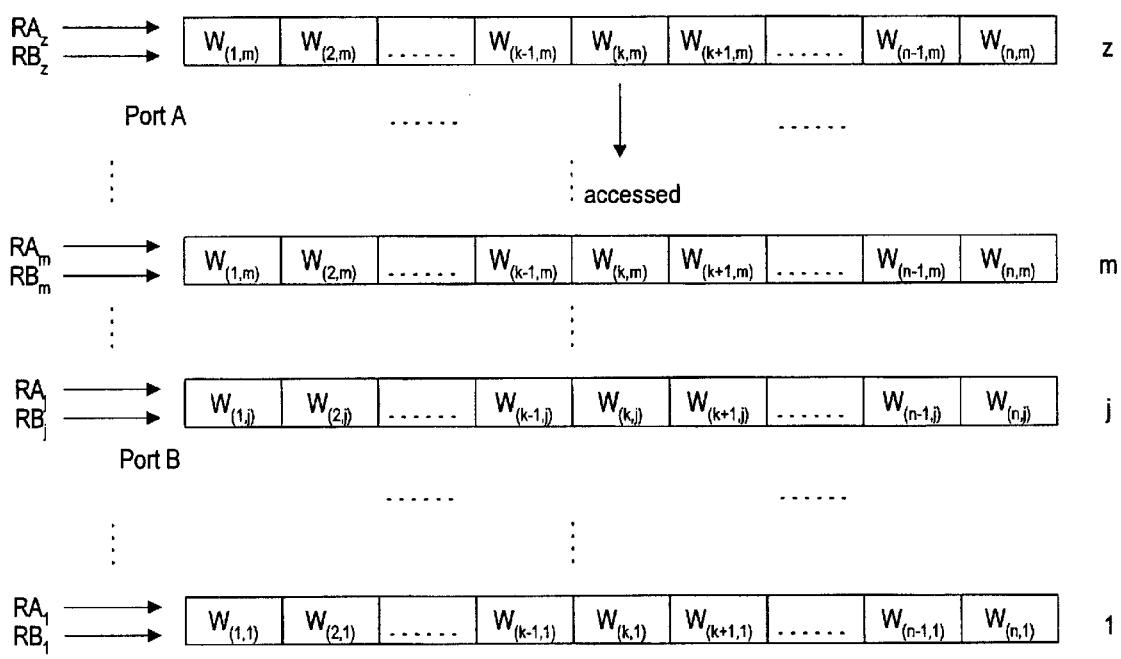
FIG. 4 shows a memory array in accordance with one embodiment of the invention.

FIG. 4 shows an array of memory cells having multiple ports. Preferably the memory cells of the array are dual port memory cells, such as those described in FIG. 3. As shown, the array comprises z number of rows, where z is a whole number. Preferably, z is equal to $2^q$, where q is a whole number. The memory array comprises first and second ports to access the memory cells. In one embodiment, the memory array is accessed by the external system through the first port (e.g., port A) while the second port (e.g., port B) is internal to the memory array. Providing a memory array that can be accessed through both ports is also useful.

A row comprises n words, where n is greater than or equal to 2. In one embodiment of the invention, a word in one of the rows is accessed. For example, the k$^{th}$ word of row m is accessed. The access, for example, is a write access. Alternatively, the access is a read access. The respective bitlines coupled to the first port of the cells of the k$^{th}$ word are coupled to the sense amplifiers and driven onto the data bus through the multiplexing circuit. In accordance with one embodiment of the invention, at least one other word of the row is refreshed through the first port during the memory access. Preferably some of the other words of the row are refreshed via the first port, and more preferably the other words of the row are refreshed via the first port. The charge stored within the storage nodes of the memory cells of the refreshed words in row m are sensed and amplified by the corresponding sense amplifiers of sense amplifier bank and written back into the memory cells.

In accordance with one embodiment of the invention, at least one word in another row of the memory array is then refreshed via the second port. For example, at least one word in row j is refreshed during the same memory access via the second port. Preferably, some of the words in row j are refreshed via the second port, more preferably the words of row j are refreshed via the second port.

As described, when an access is performed on one of the words in a row of memory cells via the first port, the other words of that row are read and thereby refreshed via the first port. Preferably, the other words of that row are refreshed. In contrast to a normal read operation, the data is not forwarded to the data bus since the data bus is connected to the written word of memory cells of that row. Also, at least one word in another row can be refreshed via the second port during the same access cycle. Preferably, another row can be refreshed via the second port during the same access cycle. In an alternative embodiment, both ports can be accessed by the external system. In the case where two different rows can be accessed, such as a write, the other words of the rows can be refreshed. This enables two rows of the array to avoid the need of a refresh or extend the refresh cycle time. As a result, performance of the memory array can be enhanced. This concept can also be applied to arrays with p number of ports, where p is greater than 2, enabling p rows to avoid refreshing or extend the refresh cycle for those p rows. Some, none, or all except one of the p ports can be used as internal ports for refreshes only. As a result, performance of the memory array can be enhanced.

Figure 5:
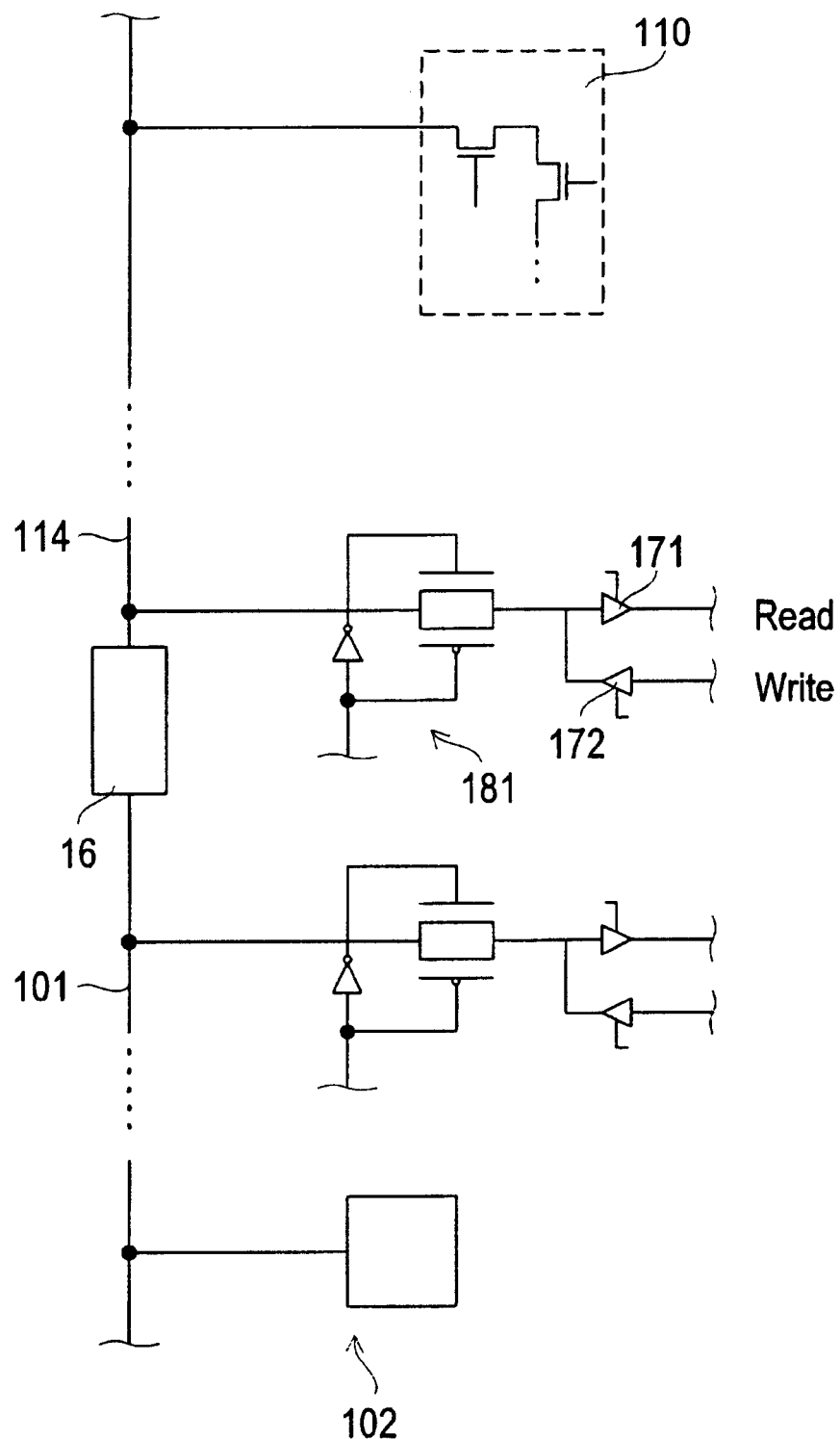
FIG. 5 shows a portion of the data path within a memory array in accordance with one embodiment of the invention.

FIG. 5 shows a portion of a data path in accordance with one embodiment of the invention. A sense amplifier 16 is connected to memory cell 110 through bitline 114. The output of the sense amplifier 16 is gated through a respective gating device 181 to the multiplexing circuit. In one embodiment, switches 171 and 172 divide the data path up to a read path which outputs data and a write path which receives data. The sense amplifier 16 is also coupled to another bitline to an open bitline architecture.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method for operating an IC comprising:
   providing the IC with memory array having a plurality of memory cells arranged in rows and columns, wherein a row of memory cells comprises n words, a word comprising x memory cells, where x is greater than 1;

performing an memory access to a selected word of a selected row having the n words during a memory access cycle; and refreshing at least one of the n words in the selected row which is not the selected ward during the memory access.

2. The method of claim 1 wherein the memory access cycle comprises a write or read access.

3. The method of claim 1 wherein providing the IC comprises providing a system on chip IC.

4. The method of claim 3 wherein the memory access cycle comprises a write or read access.

5. The method of claim 1, 2, 3, or 4 wherein the refreshing refreshes some of the other n words in to selected row which is not the selected word.

6. The method of claim 1, 2, 3, or 4 wherein the refreshing refreshes all the other n words in the selected row which is not the selected word.

7. The method of claim 1, 2, 3, or 4 wherein: providing the IC comprises providing a IC wherein the memory cells include first and second ports;

performing the memory access comprises accessing a first selected word of a first selected row via a first port and accessing a second selected word of a second row via a second port; and refreshing comprises refreshing at least one of then words in the first or second selected row which is not selected word.

8. The method of claim 7 wherein the refreshing comprises refreshing some of the n words in the selected first and second rows which are not the selected words.

9. The method of claim 7 wherein the refreshing comprises refreshing all the other n word in the selected first and second rows which are not the selected words during the memory access cycle.

10. The method of claim 7 wherein providing the IC comprises providing a IC wherein the memory cells include a first transistor, a storage transistor and a second transistor coupled in series, wherein the first transistor serves as the first port and the second transistor serves as the second port.

11. The method of claim 10 wherein the refreshing comprises refreshing some of the n words in the selected first and second rows which are not the selected words.

12. The method of claim 10 wherein the refreshing comprises refreshing all the other n words in the selected first and second rows which are not the selected words.

* * * * *